US012706592B2

(12) United States Patent
Wang

(10) Patent No.: US 12,706,592 B2
(45) Date of Patent: Aug. 11, 2026

(54) APPLICATION-SPECIFIC INTEGRATED CIRCUIT WITH INTEGRATED DIFFERENCE FILTER

(71) Applicant: Qorvo US, Inc., Greensboro, NC (US)

(72) Inventor: Shaoyun Wang, San Jose, CA (US)

(73) Assignee: Qorvo US, Inc., Greensboro, NC (US)

( * ) Notice: Subject to any disclaimer, the term of this patent is extended or adjusted under 35 U.S.C. 154(b) by 409 days.

(21) Appl. No.: 18/477,621

(22) Filed: Sep. 29, 2023

(65) Prior Publication Data

US 2024/0186987 A1 Jun. 6, 2024

Related U.S. Application Data

(60) Provisional application No. 63/386,049, filed on Dec. 5, 2022.

(51) Int. Cl.
*H03H 17/02* (2006.01)

(52) U.S. Cl.
CPC .................................. *H03H 17/02* (2013.01)

(58) Field of Classification Search
CPC ..... H03H 17/02; H03H 17/0219; G06F 17/11
See application file for complete search history.

(56) References Cited

U.S. PATENT DOCUMENTS 5,212,659 A 5/1993 Scott et al.
5,457,501 A * 10/1995 Hong ...................... H04N 9/78 348/669
5,594,612 A * 1/1997 Henrion ................ H03M 3/388 341/120
5,757,862 A * 5/1998 Ishizu ................. H04L 27/2331 329/304
5,825,898 A * 10/1998 Marash ................ H01Q 3/2611 367/121
5,831,880 A * 11/1998 Lee ........................ H03H 17/02 708/319
5,966,188 A * 10/1999 Patel ..................... H04L 1/0071 375/348
6,091,789 A * 7/2000 Weinholt ............ H04L 27/2032 375/340
6,512,555 B1 * 1/2003 Patel ..................... H04L 1/0054 348/731
10,367,477 B2 * 7/2019 Lamb ................. H03H 17/0671
10,429,208 B2 * 10/2019 Riedmueller .......... G01D 3/028
10,848,170 B1 * 11/2020 Thiagarajan ............. H03G 3/30
11,075,617 B1 * 7/2021 Carbajal Ipenza .......................... H03H 17/0664

(Continued)

FOREIGN PATENT DOCUMENTS

JP 2002271431 A 9/2002
JP 2007003524 A 1/2007

*Primary Examiner* — Jinsong Hu
*Assistant Examiner* — Rui M Hu
(74) *Attorney, Agent, or Firm* — Withrow & Terranova, P.L.L.C.

(57) ABSTRACT

Disclosed is an integrated circuit having a sensor configured to sense a stimulus and in response to output an analog signal, and an analog-to-digital converter configured to receive the analog signal and to output a stream of digital values that are in proportion to the analog signal. A difference filter is configured to receive the digital values and to subtract an N number of the digital values from an M number of the digital values to generate filtered values, wherein M and N are counting numbers.

19 Claims, 21 Drawing Sheets

(56) References Cited

U.S. PATENT DOCUMENTS

2003/0209230 A1* 11/2003 Honda ............... H03H 17/0211 341/155
2005/0289206 A1* 12/2005 Koyanagi .............. H03H 17/06 708/300
2006/0250287 A1* 11/2006 Menkhoff .......... H03H 17/0657 341/118
2007/0189400 A1* 8/2007 Nakano .............. H03H 17/0671 375/242
2008/0079594 A1* 4/2008 Tronconi ............ G01P 15/0891 340/669
2009/0060044 A1* 3/2009 Suh ........................ H04H 60/13 375/240.16
2010/0250638 A1* 9/2010 Asami ................ H03H 17/0294 708/304
2011/0004647 A1* 1/2011 Parida ................ H03H 17/0664 327/552
2014/0241539 A1* 8/2014 Bal ..................... G10L 21/0232 381/71.14
2015/0332785 A1* 11/2015 Steensgaard-Madsen .................. H03M 7/28 341/122
2017/0040977 A1* 2/2017 Heim ..................... H03H 17/06
2017/0139053 A1* 5/2017 Vishin ..................... G01S 19/33
2020/0088759 A1* 3/2020 Oshima ................... G01P 15/13
2022/0011794 A1* 1/2022 Gray ....................... G06F 3/016
2023/0082009 A1* 3/2023 Valle ........................ H04R 3/00 381/94.6
2023/0132870 A1* 5/2023 Shah .................. H03K 17/6872 324/76.11

* cited by examiner

APPLICATION-SPECIFIC INTEGRATED CIRCUIT WITH INTEGRATED DIFFERENCE FILTER

RELATED APPLICATIONS

This application claims the benefit of provisional patent application Ser. No. 63/386,049, filed Dec. 5, 2022, the disclosure of which is hereby incorporated herein by reference in its entirety.

FIELD OF THE DISCLOSURE

The present disclosure relates to filtering undesired signal components from sensors.

BACKGROUND

Some unwanted direct current signals and/or slow-changing signals superpose on the force press signals as shown in FIG. 1. Correctly detecting force presses has been difficult because of these unwanted signals. The unwanted signals make the pre-press a moving target, and it is difficult to use a prefixed threshold, which corresponds to a specific Newton value, to quantitate the force applied to the sensor. More difficult is to calculate a multistage force press.

SUMMARY

Disclosed is an integrated circuit having a sensor configured to sense a stimulus and in response to output an analog signal, and an analog-to-digital converter configured to receive the analog signal and to output a stream of digital values that are in proportion to the analog signal. A difference filter is configured to receive the digital values and to subtract an N number of the digital values from an M number of the digital values to generate filtered values, wherein M and N are counting numbers.

Difference filters of the present disclosure are constructed to remove the direct current stress signals and to reduce the slow-changing signals. The disclosed difference filters subtract the output of an earlier boxcar filter from a later boxcar filter. The coefficient set of a 4+4 order difference filter is [1 1 1 1 −1 −1 −1 −1]. There is no complex calculation because all the coefficients are just either 1 or −1.

The disclosed filter removes all the direct current stresses and reduces all the slow-changing signals, and it produces much better results than that of a low-pass IIR filter. This filter can easily be implemented in an application-specific integrated circuit and/or software.

In another aspect, any of the foregoing aspects individually or together, and/or various separate aspects and features as described herein, may be combined for additional advantage. Any of the various features and elements as disclosed herein may be combined with one or more other disclosed features and elements unless indicated to the contrary herein.

Those skilled in the art will appreciate the scope of the present disclosure and realize additional aspects thereof after reading the following detailed description of the preferred embodiments in association with the accompanying drawing figures.

BRIEF DESCRIPTION OF THE DRAWING FIGURES

The accompanying drawing figures incorporated in and forming a part of this specification illustrate several aspects of the disclosure and, together with the description, serve to explain the principles of the disclosure.

DETAILED DESCRIPTION

Figure 1:
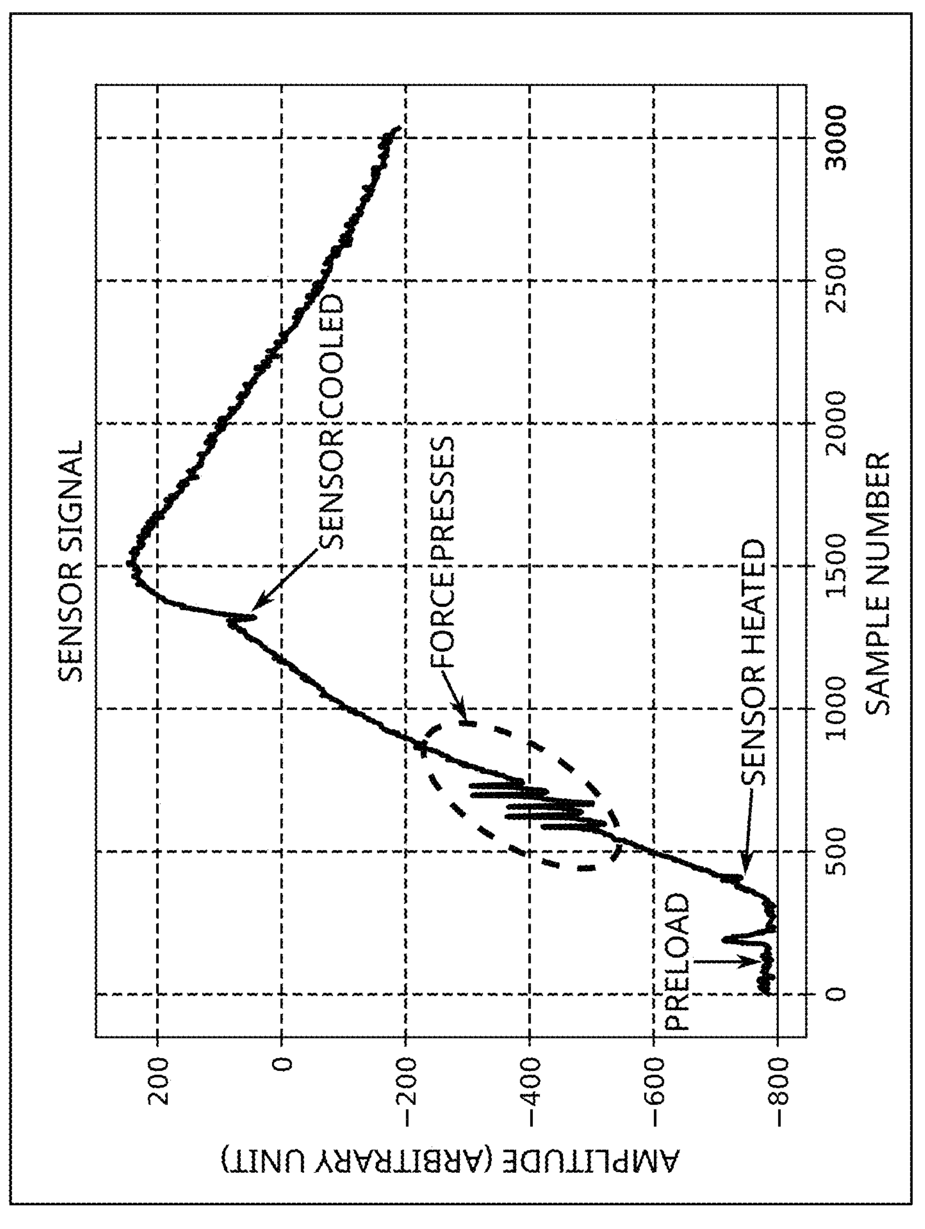
FIG. 1 is an example of an analog signal from a sensor that is configured to sense stimuli such as mechanical forces and accelerations.

The embodiments set forth below represent the necessary information to enable those skilled in the art to practice the embodiments and illustrate the best mode of practicing the embodiments. Upon reading the following description in light of the accompanying drawing figures, those skilled in the art will understand the concepts of the disclosure and will recognize applications of these concepts not particularly addressed herein. It should be understood that these concepts and applications fall within the scope of the disclosure and the accompanying claims.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the present disclosure. As used herein, the term "and/or" includes any and all combinations of one or more of the associated listed items.

It will be understood that when an element such as a layer, region, or substrate is referred to as being "on" or extending "onto" another element, it can be directly on or extend directly onto the other element or intervening elements may also be present. In contrast, when an element is referred to as being "directly on" or extending "directly onto" another element, there are no intervening elements present. Likewise, it will be understood that when an element such as a layer, region, or substrate is referred to as being "over" or extending "over" another element, it can be directly over or extend directly over the other element or intervening elements may also be present. In contrast, when an element is referred to as being "directly over" or extending "directly over" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

Relative terms such as "below" or "above" or "upper" or "lower" or "horizontal" or "vertical" may be used herein to describe a relationship of one element, layer, or region to another element, layer, or region as illustrated in the Figures. It will be understood that these terms and those discussed above are intended to encompass different orientations of the device in addition to the orientation depicted in the Figures.

The terminology used herein is for the purpose of describing particular embodiments only and is not intended to be limiting of the disclosure. As used herein, the singular forms "a," "an," and "the" are intended to include the plural forms as well, unless the context clearly indicates otherwise. It will be further understood that the terms "comprises," "comprising," "includes," and/or "including" when used herein specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this disclosure belongs. It will be further understood that terms used herein should be interpreted as having a meaning that is consistent with their meaning in the context of this specification and the relevant art and will not be interpreted in an idealized or overly formal sense unless expressly so defined herein.

Embodiments are described herein with reference to schematic illustrations of embodiments of the disclosure. As such, the actual dimensions of the layers and elements can be different, and variations from the shapes of the illustrations as a result, for example, of manufacturing techniques and/or tolerances, are expected. For example, a region illustrated or described as square or rectangular can have rounded or curved features, and regions shown as straight lines may have some irregularity. Thus, the regions illustrated in the figures are schematic and their shapes are not intended to illustrate the precise shape of a region of a device and are not intended to limit the scope of the disclosure. Additionally, sizes of structures or regions may be exaggerated relative to other structures or regions for illustrative purposes and, thus, are provided to illustrate the general structures of the present subject matter and may or may not be drawn to scale. Common elements between figures may be shown herein with common element numbers and may not be subsequently re-described.

FIG. 1 is an example of an analog signal from a sensor that is configured to sense stimuli such as mechanical forces and accelerations. In the example graph of FIG. 1 the analog signal is generated by the sensor in response to forceful presses against the sensor. Amplitude of the analog signal is in proportion to the stimuli experienced by sensor. The analog signal is an electrical signal that may be, for example, voltage in the range of millivolts or current in the range of milliamperes.

Note from the graph that preload forces stimulating the sensor are from several sources, such as packaging stress, bump soldering stress, and printed circuit board stress. FIG. 1 also shows a relatively large thermal response component of the analog signal caused by a module case carrying the sensor going into and out of water having different temperatures. Mixed in with the thermal response are also undesirable force response due to mechanical stresses caused by a contraction or an expansion of the module case. In the exemplary analog signal depicted in FIG. 1, force presses depicted in a dashed ellipse are desired components of the analog signal that need to be extracted and detected to make use of the sensor. As such, all other stimuli responses such as packaging stress, bump soldering stress, printed circuit board stress, and thermal transients experienced by the sensor need to be filtered from the analog signal before the force presses can be extracted and detected. Without filtering, substantial shifts in pre-press levels may trigger a detection threshold that should be considered as a false alarm for a non-existent press of the sensor.

Figure 2:
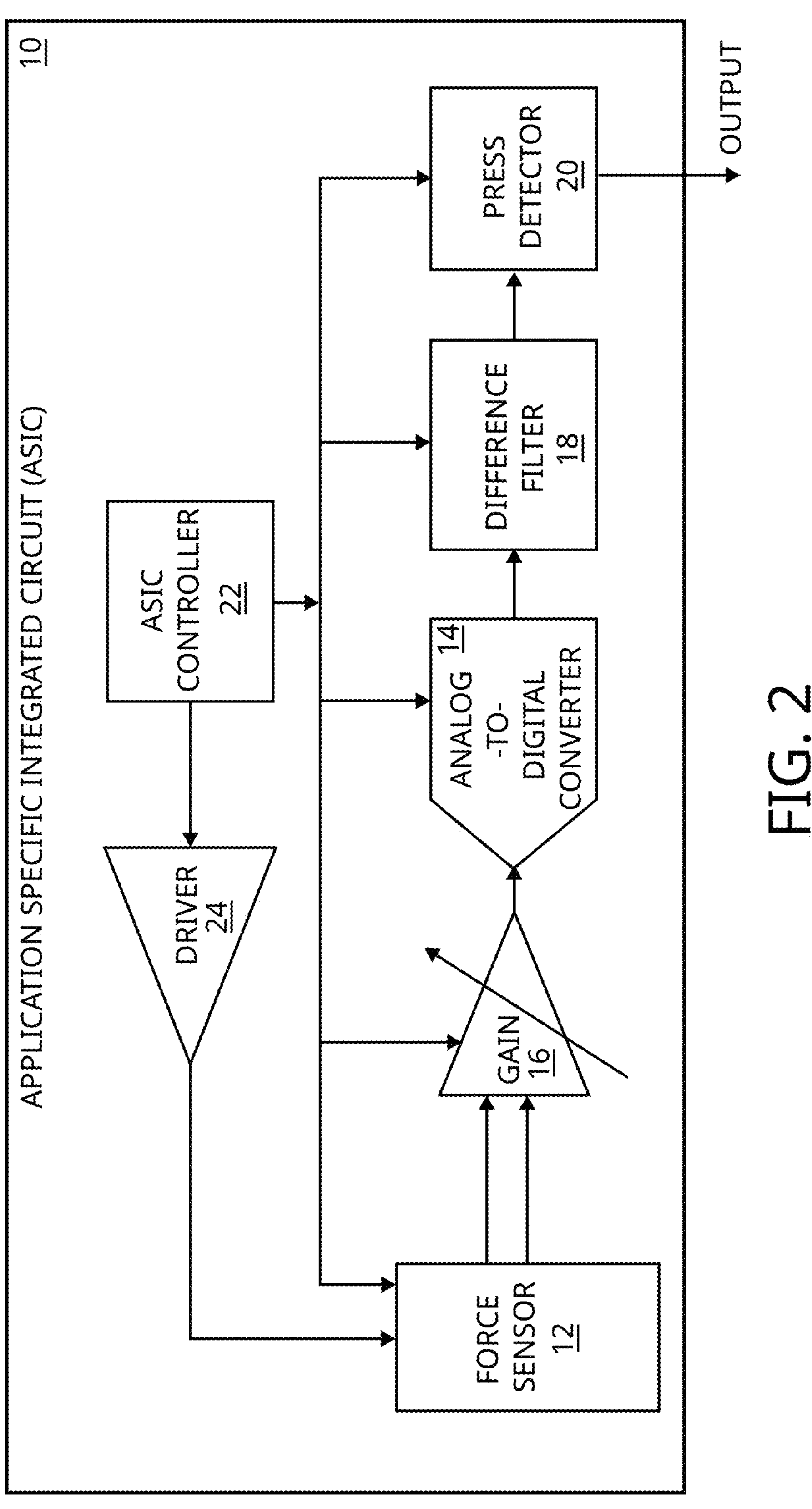
FIG. 2 is a diagram of an exemplary embodiment of an application-specific integrated circuit (ASIC) that in accordance with the present disclosure is configured to process an analog signal such as the analog sensor signal of FIG. 1.

FIG. 2 is a diagram of an exemplary embodiment of an application-specific integrated circuit 10 that in accordance with the present disclosure is configured to process an analog signal from a force-sensing type sensor 12 to extract and detect the presses within the analog signal such as the force presses within the dashed ellipse in FIG. 1.

An analog-to-digital converter 14 is configured to receive the analog signal and output a digital signal of a stream of digital values that are in proportion to the analog signal. In some embodiments, a gain stage 16 may be coupled between the sensor 12 and the analog-to-digital converter 14. In the exemplary embodiment of FIG. 2, the gain stage 16 is configured to scale the amplitude of the analog signal before being converted to the digital signal by the analog-to-digital converter 14. The gain stage 16 of the exemplary embodiment is configured to receive the analog signal in differential form and convert the amplified or attenuated version of the analog signal to a form for the analog-to-digital converter 14. A controller 22 is further configured to set a gain level for the gain stage that scales the amplitude of the analog sensor signal.

A difference filter 18 is configured to receive the digital signal and filter the digital signal to remove undesirable frequency components that include the thermal response components and preload components that remain within the digital signal. The difference filter 18 is a type of band-pass filter configured to remove direct current components and the slow-changing signal components while permitting a filtered signal still to have a moving pre-press force reading. Transients of the undesirable components are of relatively substantially lower frequency in comparison to the transients of the force presses. As such, the undesirable components have amplitudes that are substantially reduced below an amplitude threshold of a stimulus detector 20, which in this embodiment is a press detector 20. An output of the stimulus detector 20 is available for an external processor (not shown).

The application-specific integrated circuit 10 may also include a controller 22 that is configured to control and adjust various settings of the sensor 12, the analog-to-digital converter 14, the difference filter 18, and the stimulus detector 20. For example, the controller 22 may be configured to generate control signals that level shift the output of the sensor 12, set resolution for the analog-to-digital converter 14, establish the order of the difference filter 18, and set amplitude thresholds of the stimulus detector 20. A driver stage 24 for the sensor 12 is configured to energize the sensor 12. In the exemplary embodiment of FIG. 2, the driver stage 24 may also be configured to be controlled by the controller 22. For example, the controller 22 may be further configured to generate a driver control signal that sets the energization level and time interval provided to the sensor 12 by the driver stage 24.

The difference filter 18 is configured to receive the digital values and in response to subtract the average of an N number of the digital values from the average of an M number of the digital values to generate filtered values in accordance with a difference filter equation, wherein M and N are counting numbers. At least some embodiments of the difference filter 18 are configured to skip some digital values in an (M+Z+N)th order difference filter, wherein Z is a counting number of digital values to be skipped. If no digital values are to be skipped, Z will be set to zero.

The difference filter equation for the difference filter 18 of an (M+Z+N)th order is as follows:

$$y(n) = \frac{1}{M}\sum_{i=n-M+1}^{n} x(i) - \frac{1}{N}\sum_{j=n-M-N-Z+1}^{n-M-Z} x(j) \tag{1}$$

The difference filter equation for the difference filter 18 of a (4+0+2)th order is as follows:

$$y(n) = \frac{x(n) + x(n-1) + x(n-2) + x(n-3)}{4} - \frac{x(n-4) + x(n-5)}{2} \tag{2}$$

Figure 3:
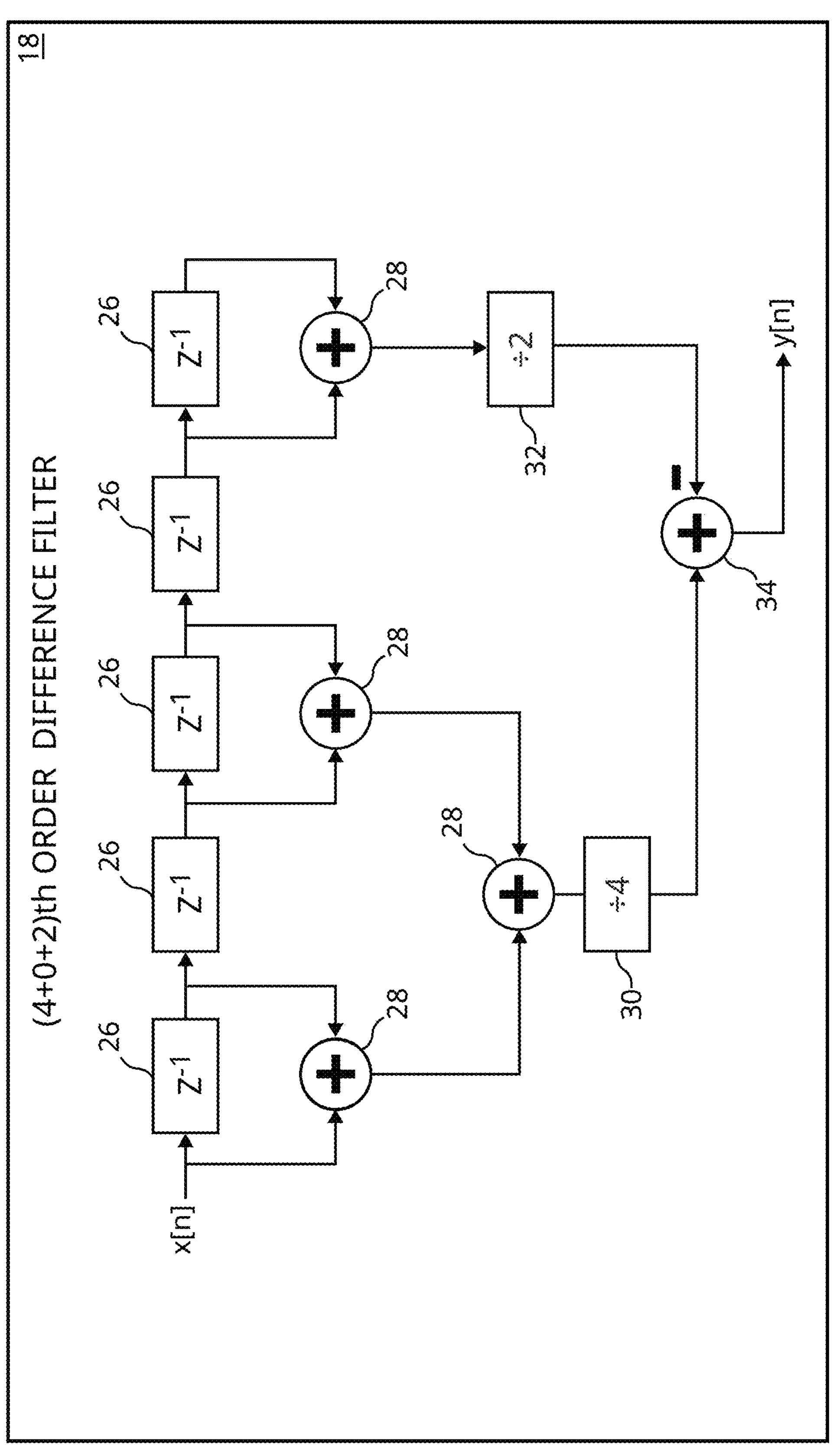
FIG. 3 is a diagram of a (4+0+2)th order version of a difference filter integrated within the ASIC of FIG. 2.

FIG. 3 is a diagram of the difference filter 18 with a configuration that realizes the (4+0+2)th order given by equation 2. This configuration employs five unit delays 26, four adders 28, a first divider 30, a second divider 32, and a subtractor 34. These components may be realized in electronic hardware logic and/or instantiated by way of a digital signal processor (DSP) integrated within the application-specific integrated circuit 10. The unit delays 26 provide the operands x(n−1), x(n−2), x(n−3), x(n−4), and x(n−5), respectively. The adders 28 correspond to the addition operators in equation 2. The first divider 30 and the second divider 32 are bitwise shift right operations that may not require additional hardware to implement because these operations are typically available with a DSP. In the embodiment of the difference filter 18 of FIG. 3, the (4+0+2) order of the difference filter 18 requires that the summation of the first term of equation 2 is divided by four and the second term of equation 2 is divided by two. The divide by four configured for the first divider 30 is achieved by shifting right the summation of the first term of equation 2 by two bits while the divide by two of the second divider 32 is achieved by shifting right the summation of the second term of equation 2 by one bit.

Figure 4:
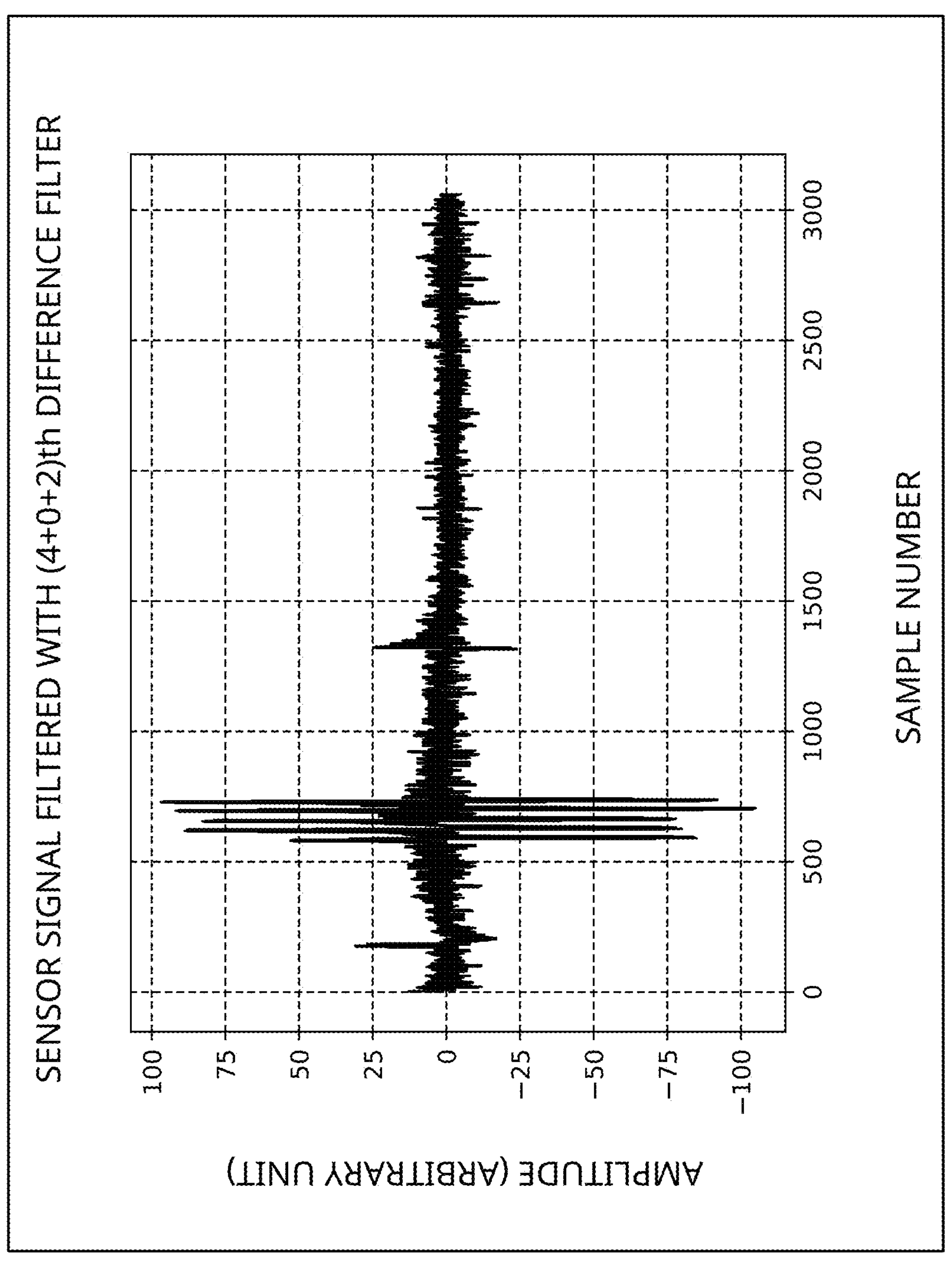
FIG. 4 is a graph of a filtered sensor signal that is output from the (4+0+2)th order version of the difference filter.

FIG. 4 is a graph of a filtered sensor signal that is output from the (4+0+2)th order version of the difference filter 18 having the configuration depicted in FIG. 3. The unfiltered sensor signal of FIG. 1 was input into the (4+0+2)th order version of difference filter 18 to produce the filtered sensor signal of FIG. 4. Notice that the substantially large amplitude of relatively slow-changing components of the unfiltered signal has been substantially removed. The relatively higher frequency force press components of the filtered sensor signal can now be detected by the stimulus detector 20.

In another example, a (4+0+4)th order filter is given as follows:

$$y(n) = \frac{x(n) + x(n-1) + x(n-2) + x(n-3)}{4} - \frac{x(n-4) + x(n-5) + x(n-6) + x(n-7)}{4} \tag{3}$$

Figure 5:
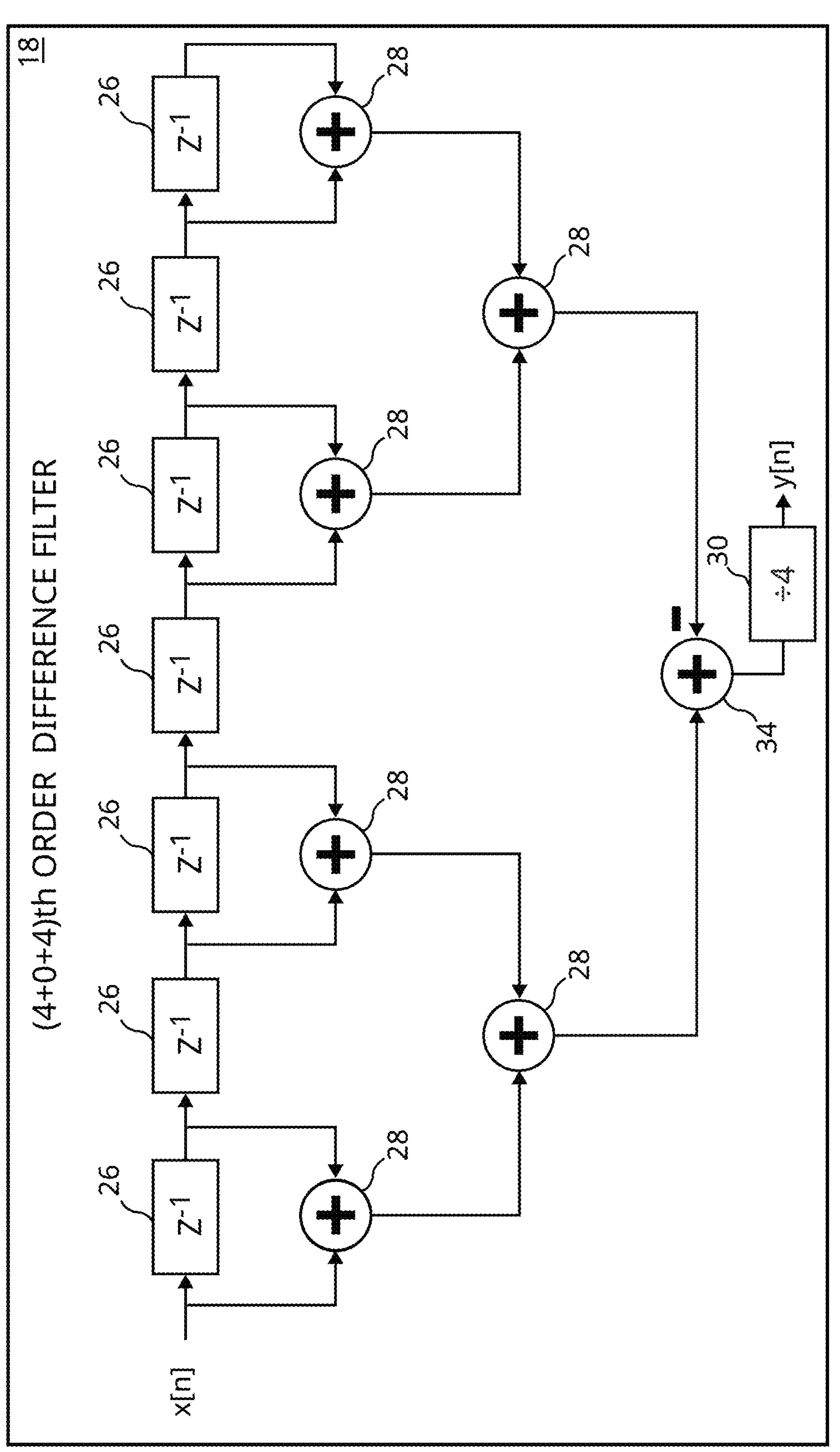
FIG. 5 is a diagram of a (4+0+4)th order version of the difference filter integrated within the ASIC of FIG. 2.

FIG. 5 is a diagram of the difference filter 18 with a configuration that realizes the (4+0+4)th order given by equation 3. This configuration employs two additional unit delays 26 for a total of seven, and two additional adders 28 for a total of six, and the subtractor 34. These components may be realized in electronic hardware logic and/or instantiated by way of a digital signal processor (DSP) integrated within the application-specific integrated circuit 10. The unit delays 26 provide the operands x(n−1), x(n−2), x(n−3), x(n−4), x(n−5), x(n−6), and x(n−7), respectively. A single divide by four operations may be executed by the divider 30 after the subtractor 34 subtracts the summed operands from the two terms of equation 3.

Figure 6:
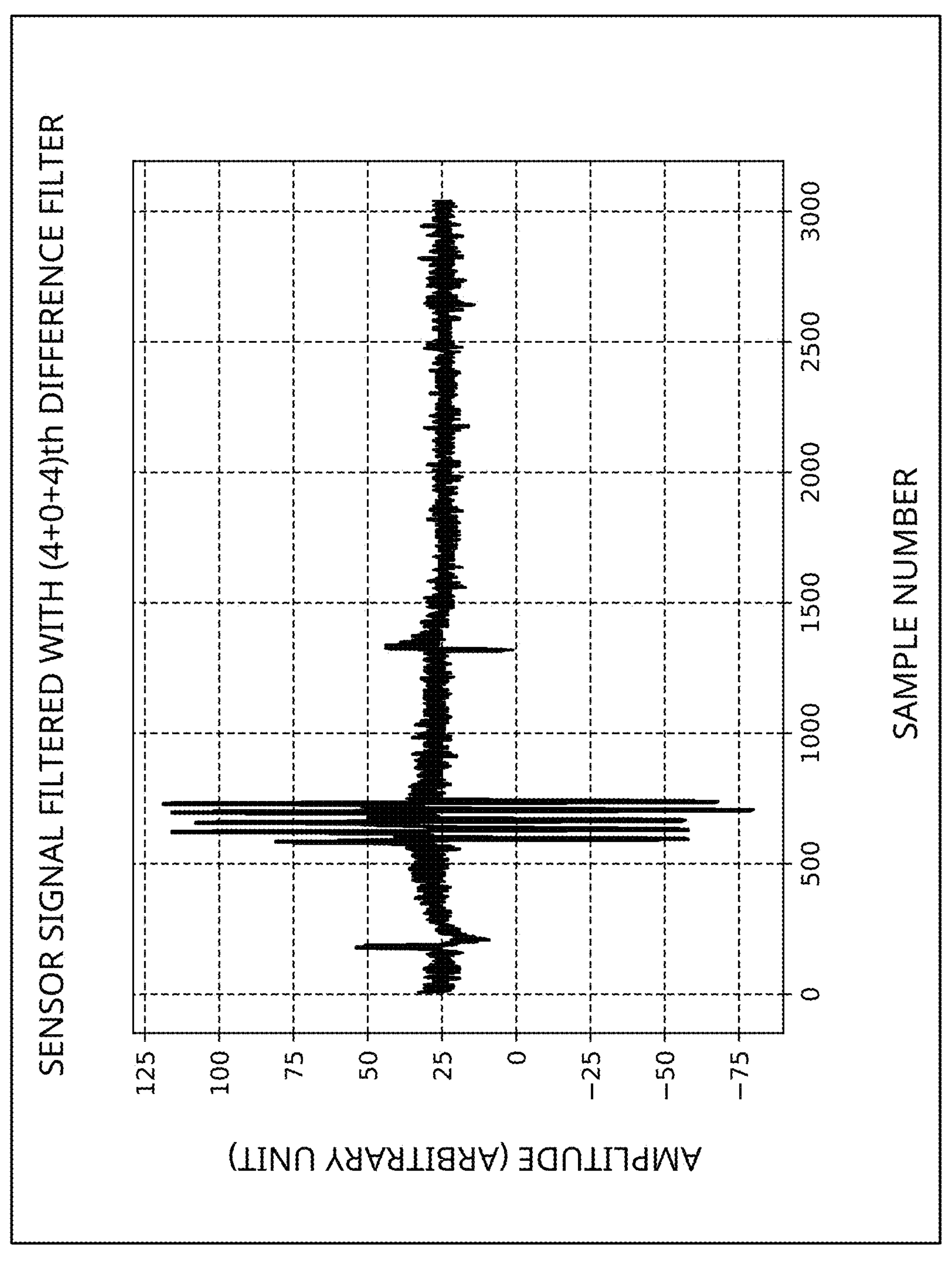
FIG. 6 is a graph of a filtered sensor signal that is output from the (4+0+4)th order version of the difference filter depicted in FIG. 5.

FIG. 6 is a graph of a filtered sensor signal that is output from the (4+0+4)th order version of the difference filter 18 having the configuration depicted in FIG. 5. The unfiltered sensor signal of FIG. 1 was input into the (4+0+4)th order version of difference filter 18 to produce the filtered sensor signal of FIG. 6. Notice that the substantially large amplitude of relatively slow-changing components of the unfiltered signal has been substantially removed. The relatively higher frequency force press components of the filtered sensor signal can now be relatively easily detected by the stimulus detector 20. In comparison with the filtered sensor signal of FIG. 4 produced by the (4+0+2)th order configuration, the filtered sensor signal of FIG. 6 produced by the (4+0+4)th order configuration has a higher signal-to-noise ratio.

Figure 7:
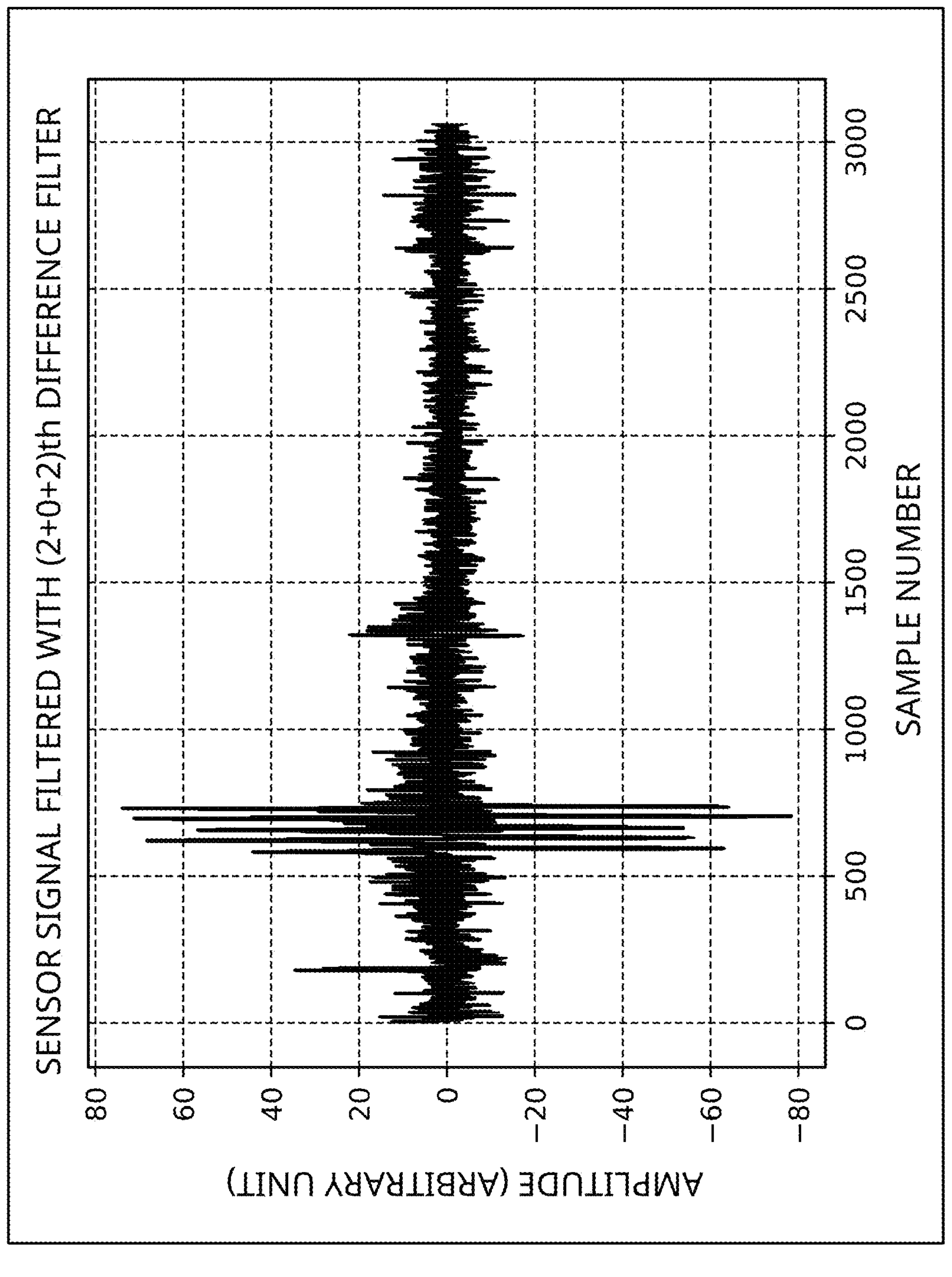
FIG. 7 is a graph of a filtered sensor signal that is output from a (2+0+2)th order version of the difference filter.
Figure 8:
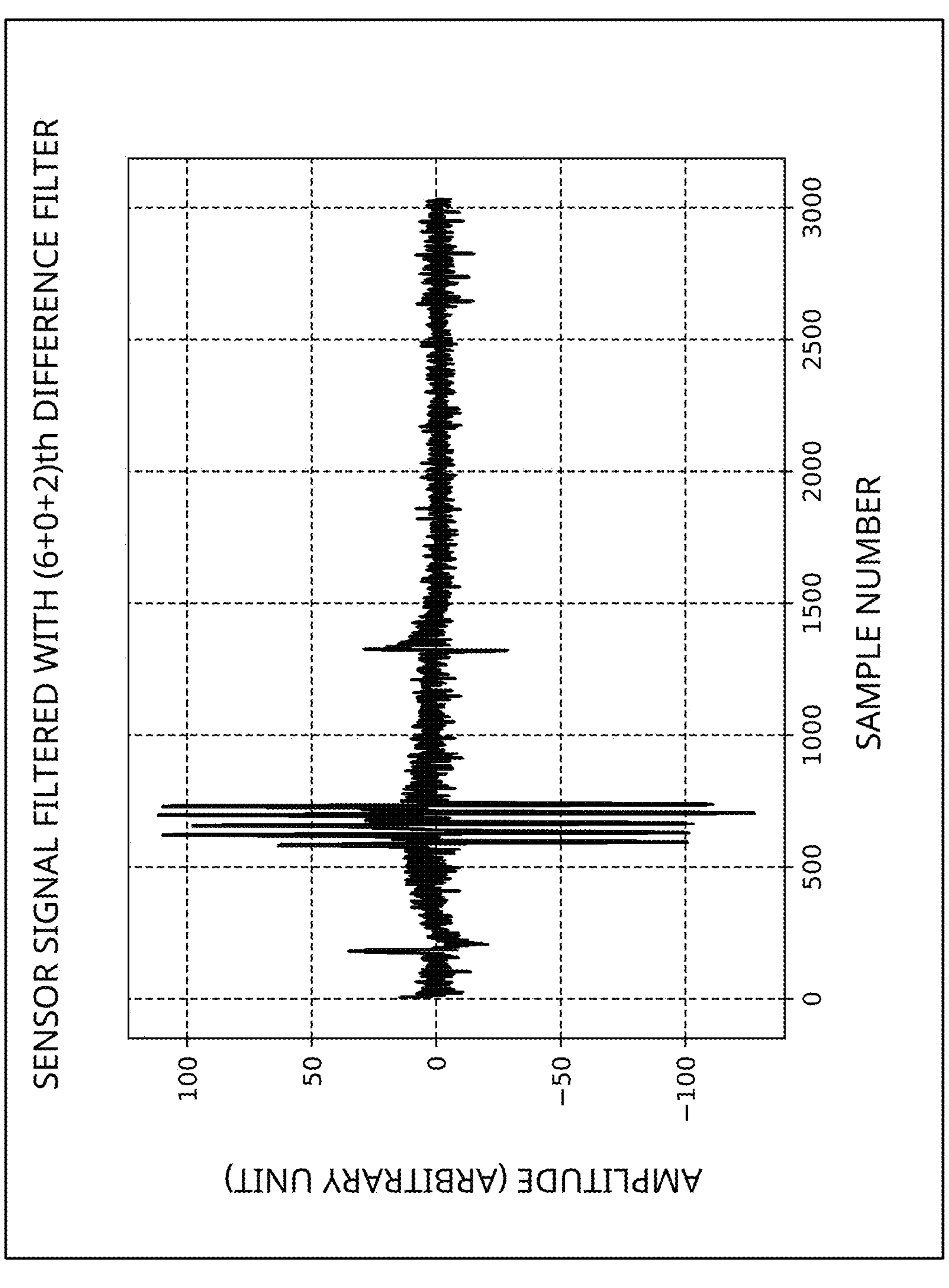
FIG. 8 is a graph of a filtered sensor signal that is output from a (6+0+2)th order version of the difference filter.

FIG. 7 is a graph of a filtered sensor signal that is output from a (2+0+2)th order version of the difference filter 18. FIG. 8 is a graph of a filtered sensor signal that is output from a (6+0+2)th order version of the difference filter 18.

Figure 9:
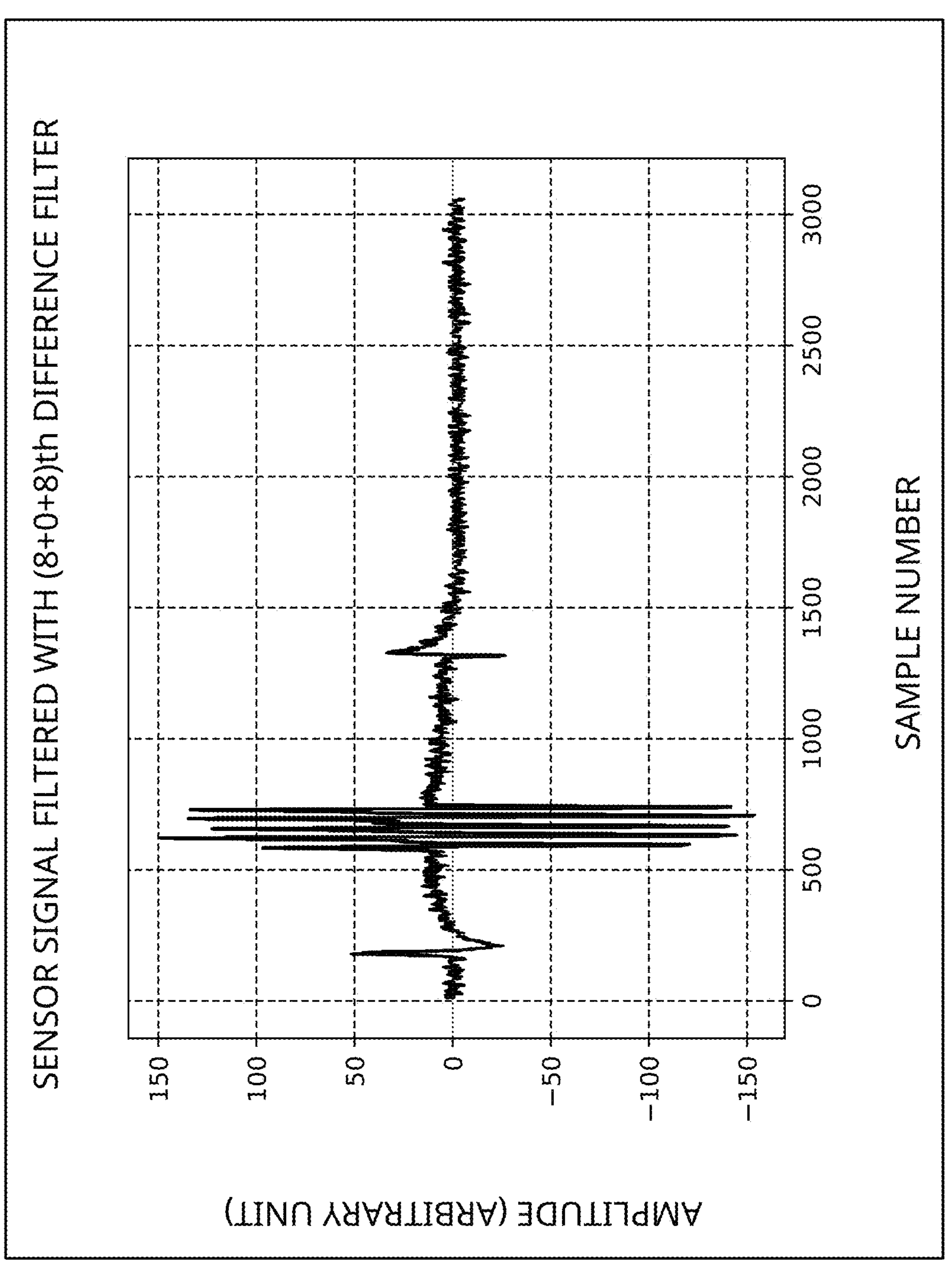
FIG. 9 is a graph of a filtered sensor signal that is output from an (8+0+8)th order version of the difference filter.
Figure 10:
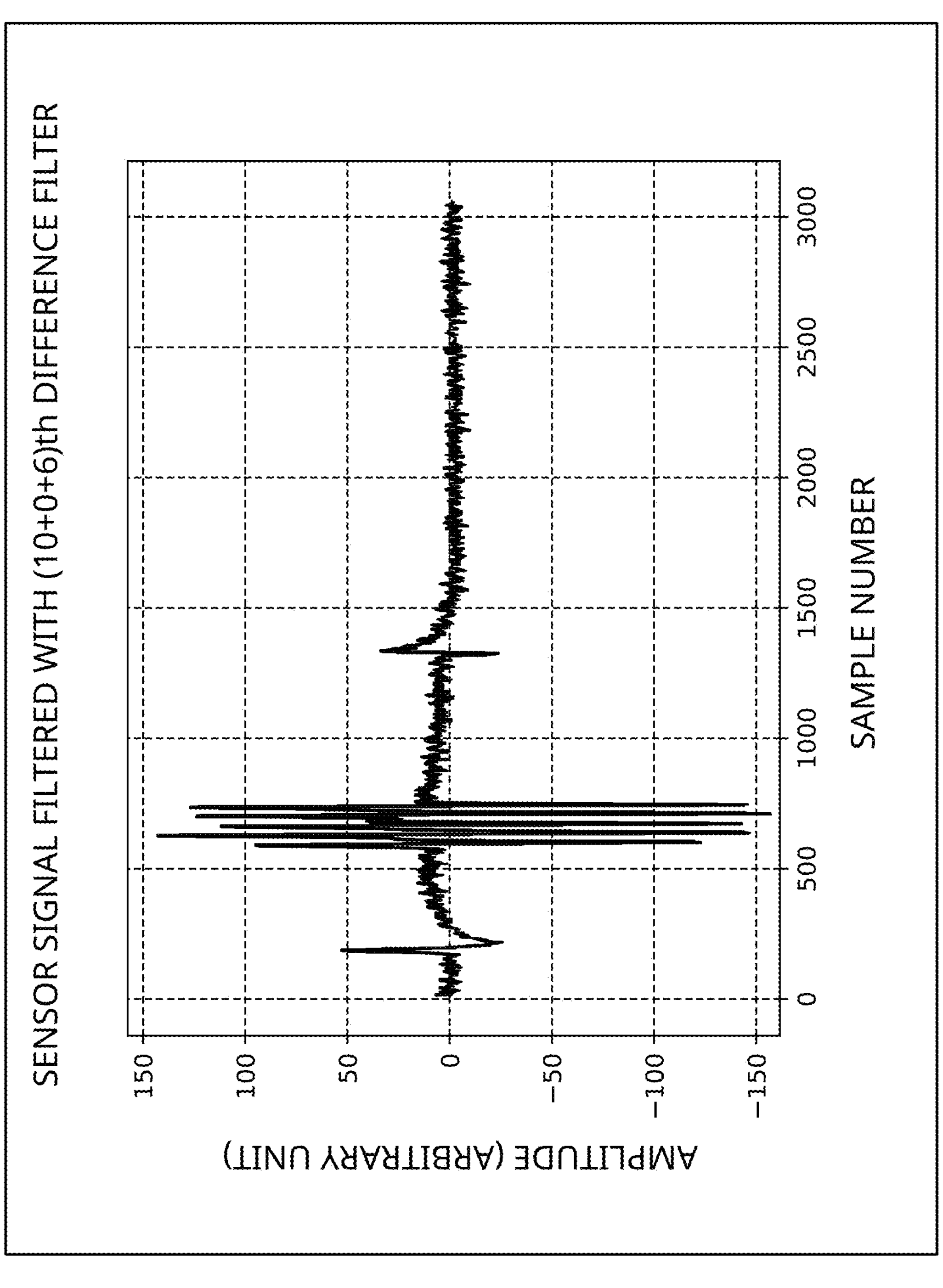
FIG. 10 is a graph of a filtered sensor signal that is output from an (10+0+6)th order version of the difference filter.
Figure 11:
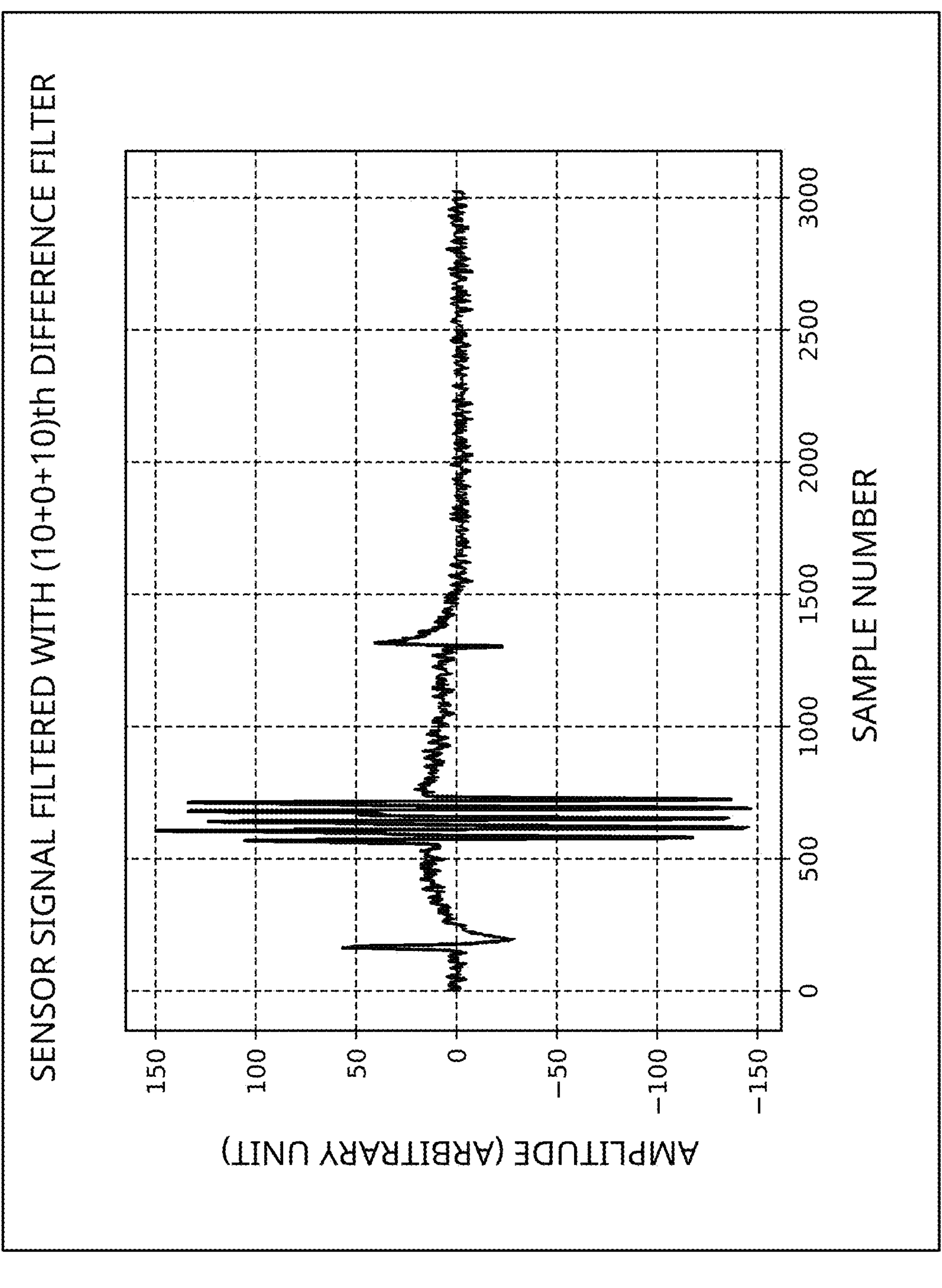
FIG. 11 is a graph of a filtered sensor signal that is output from an (10+0+10)th order version of the difference filter.

FIG. 9 is a graph of a filtered sensor signal that is output from an (8+0+8)th order version of the difference filter 18. FIG. 10 is a graph of a filtered sensor signal that is output from an (10+0+6)th order version of the difference filter 18. FIG. 11 is a graph of a filtered sensor signal that is output from an (10+0+10)th order version of the difference filter 18. Notice that the pre-press component is less removed with some higher order difference filter configurations.

Figure 12A:
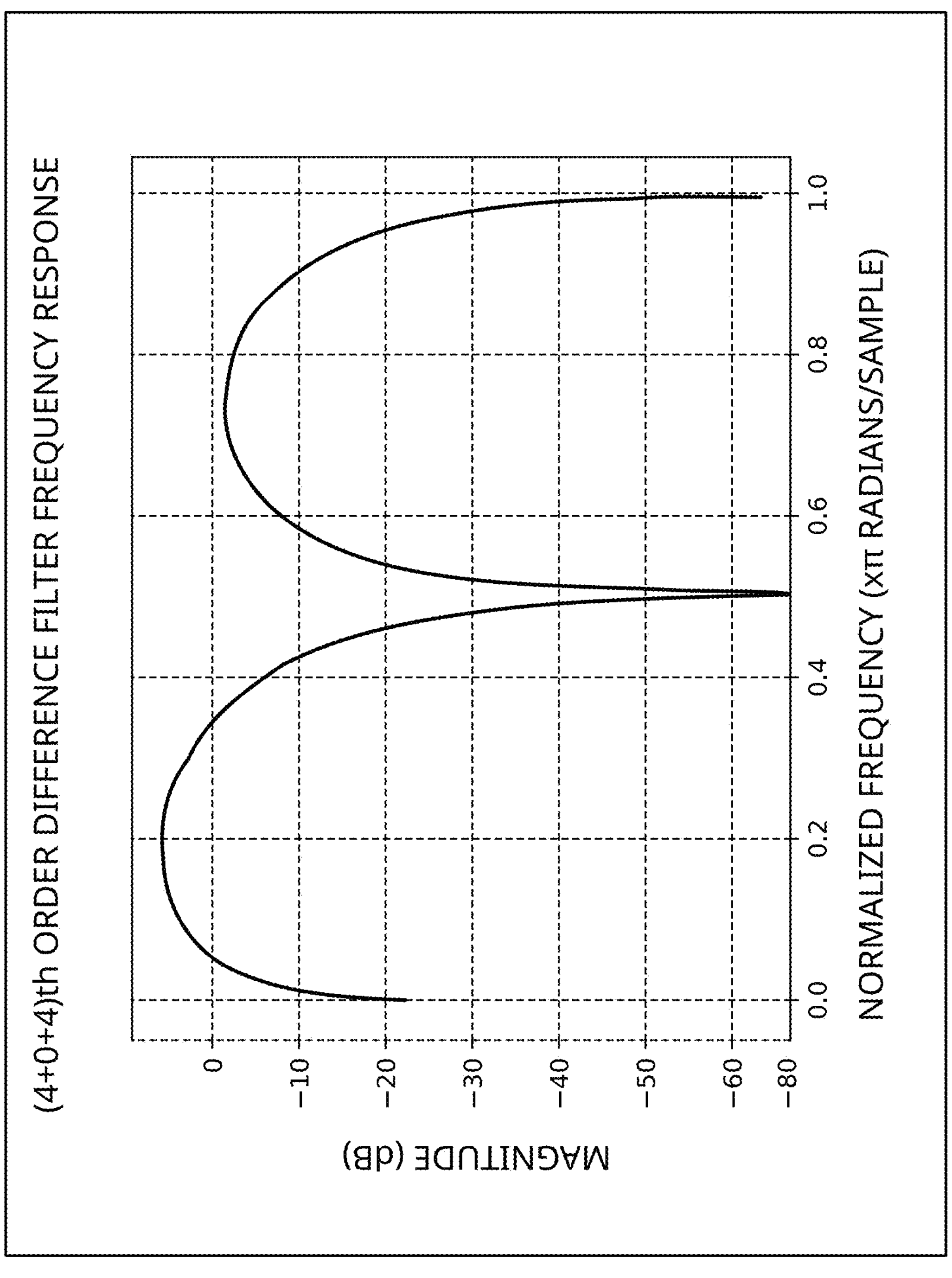
FIG. 12A is a graph of magnitude versus normalized frequency for a (4+0+4)th order difference filter.
Figure 12B:
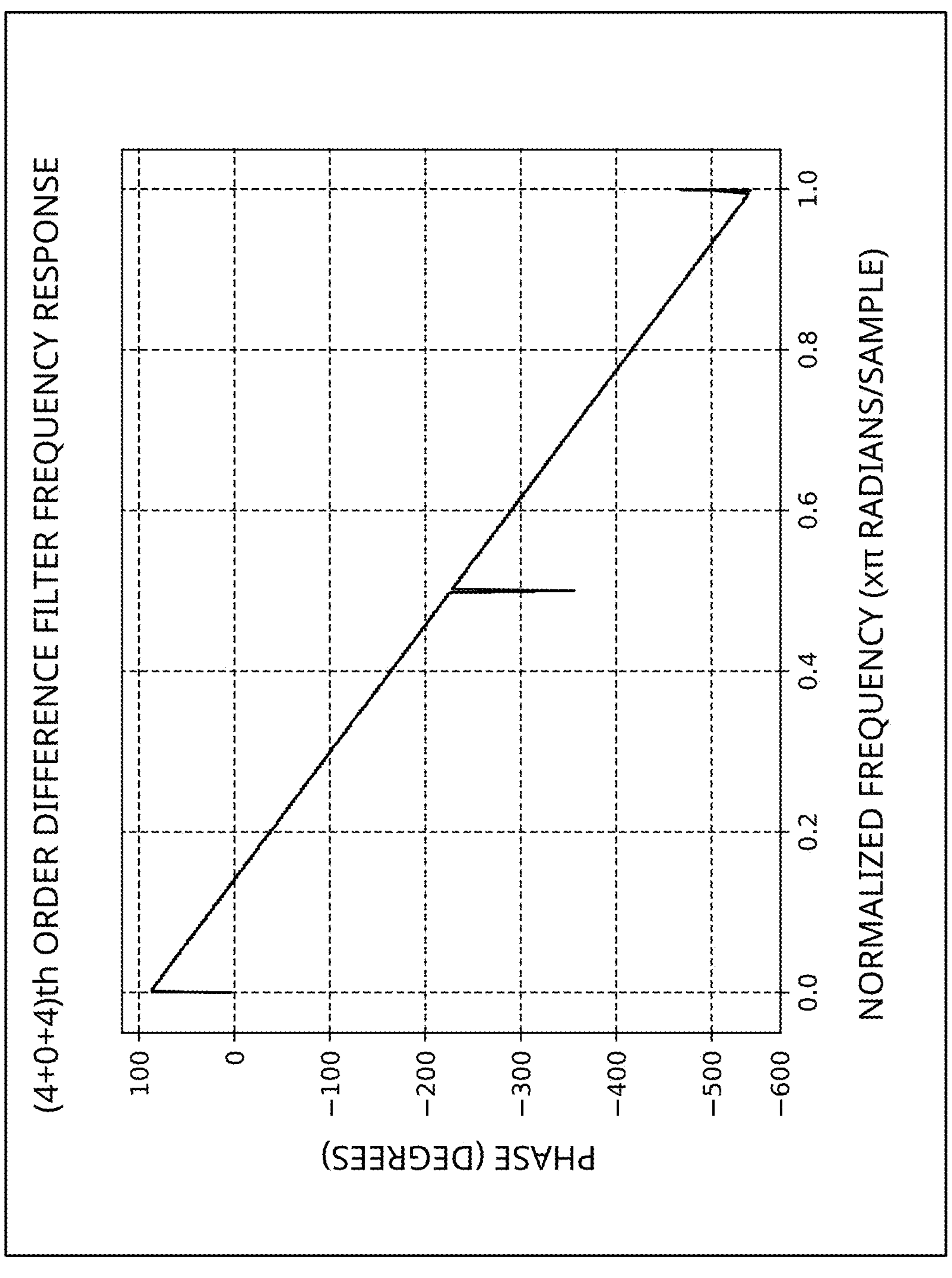
FIG. 12B is a graph of phase versus normalized frequency for a (4+0+4)th order difference filter.

FIG. 12A is a graph of magnitude versus normalized frequency for a (4+0+4)th order difference filter. FIG. 12B is a graph of phase versus normalized frequency for a (4+0+4)th order difference filter.

Figure 13A:
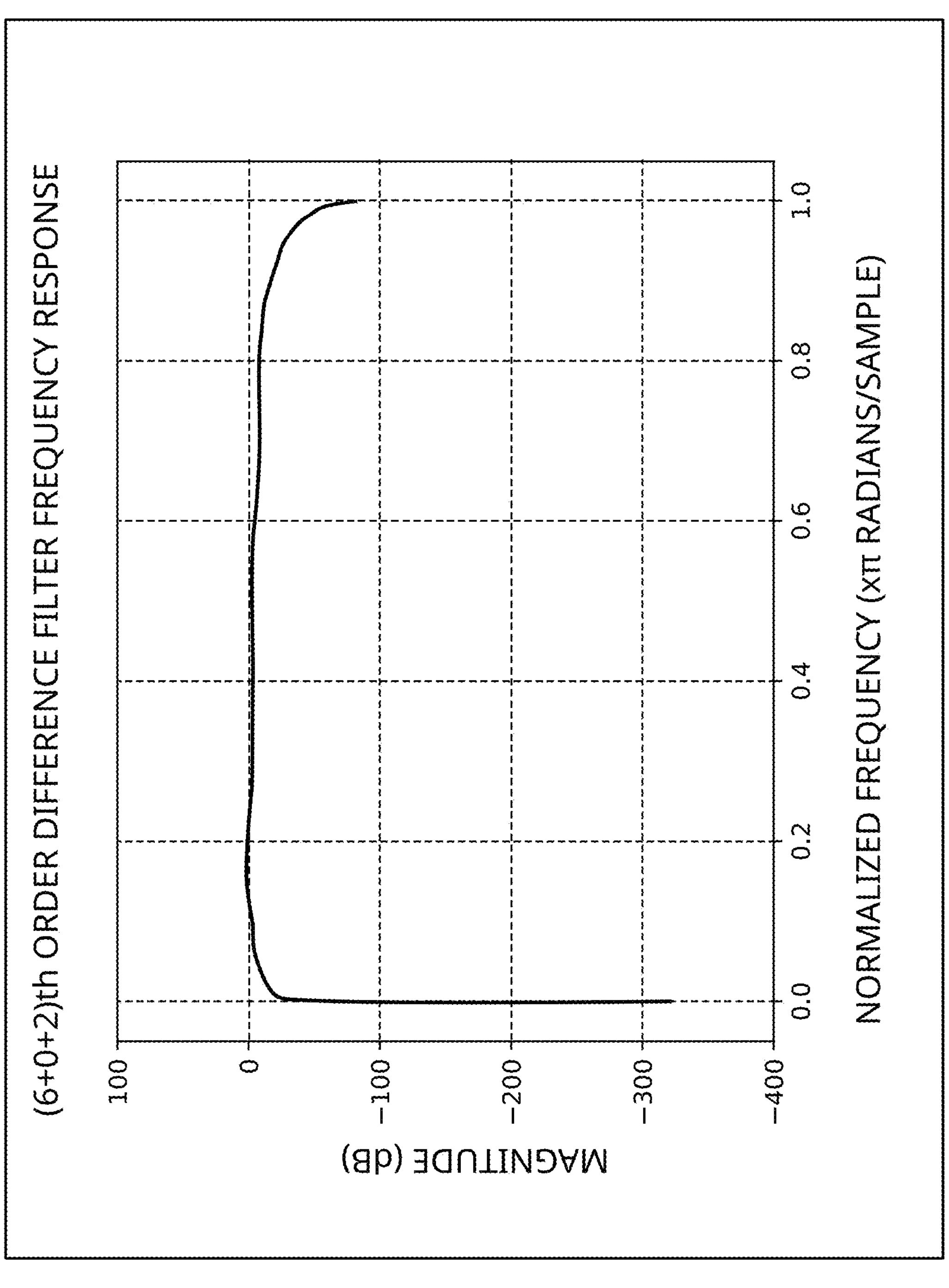
FIG. 13A is a graph of magnitude versus normalized frequency for a (6+0+2)th order difference filter.
Figure 13B:
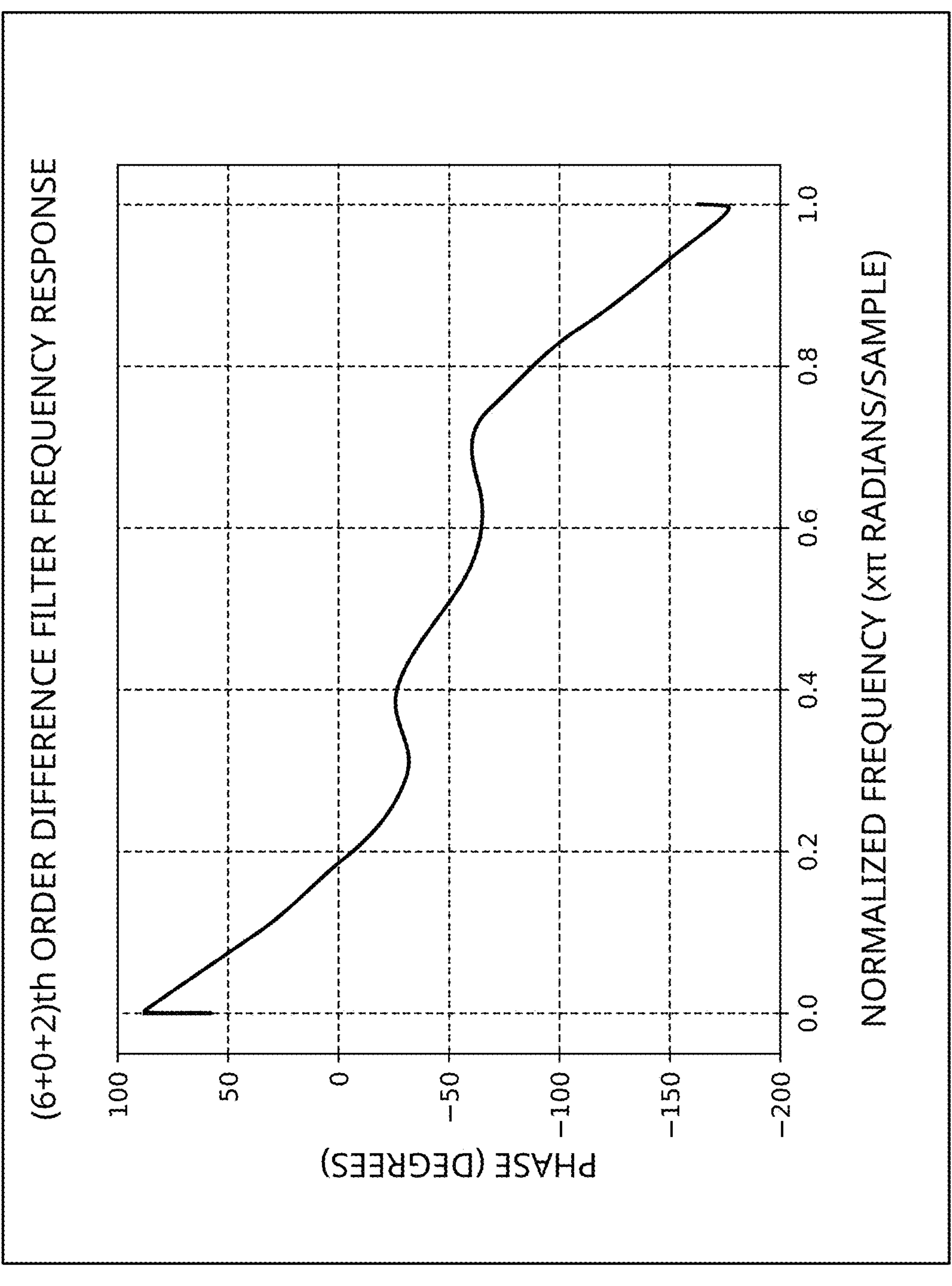
FIG. 13B is a graph of phase versus normalized frequency for a (6+0+2)th order difference filter.

FIG. 13A is a graph of magnitude versus normalized frequency for a (6+0+2)th order difference filter. FIG. 13B is a graph of phase versus normalized frequency for a (6+0+2)th order difference filter.

Figure 14A:
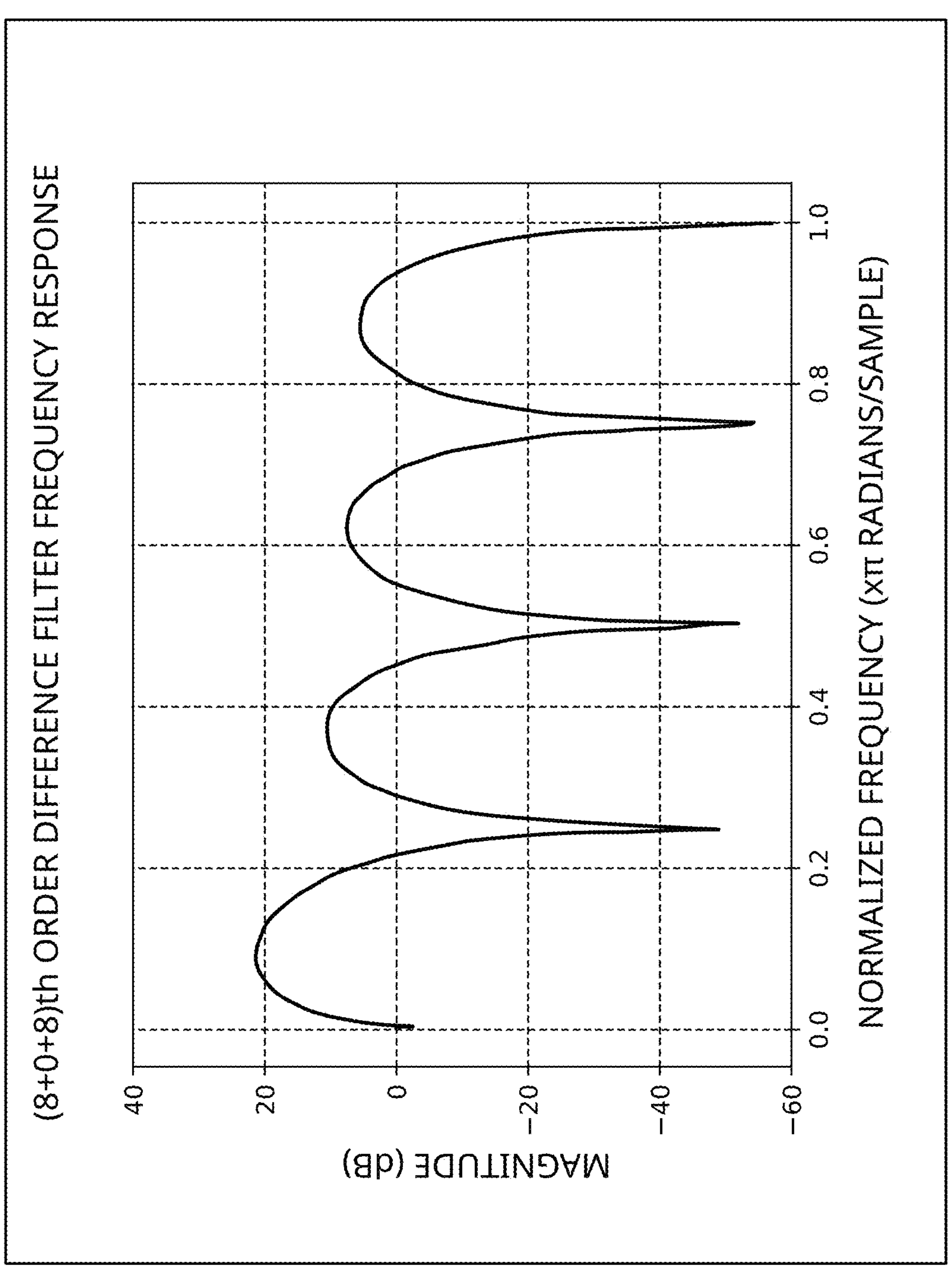
FIG. 14A is a graph of magnitude versus normalized frequency for a (8+0+8)th order difference filter.
Figure 14B:
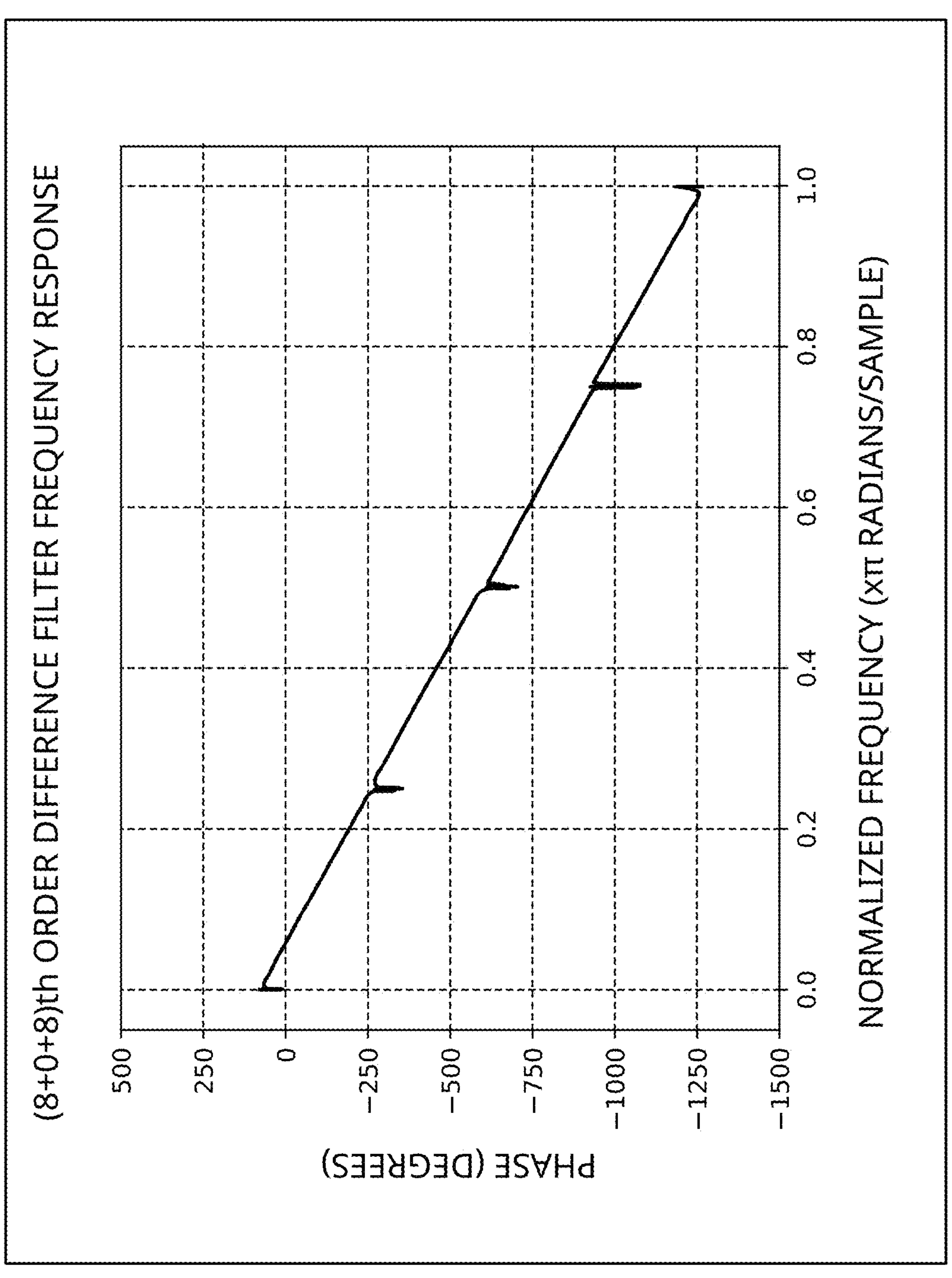
FIG. 14B is a graph of phase versus normalized frequency for a (8+0+8)th order difference filter.

FIG. 14A is a graph of magnitude versus normalized frequency for a (8+0+8)th order difference filter. FIG. 14B is a graph of phase versus normalized frequency for a (8+0+8)th order difference filter.

Figure 15:
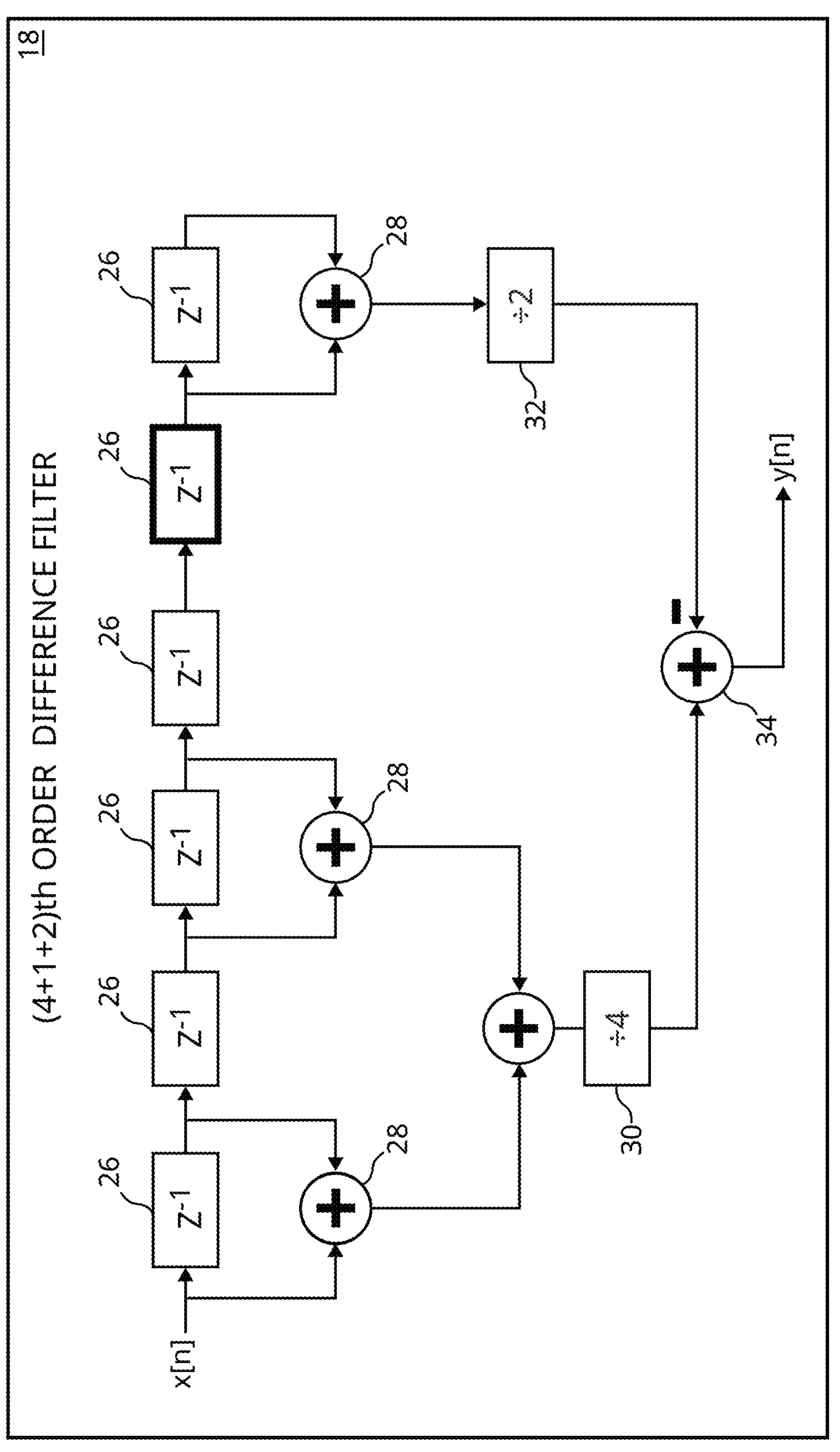
FIG. 15 is a diagram of a (4+1+2)th order version of the difference filter integrated within the ASIC of FIG. 2.

FIG. 15 is a diagram of a (4+1+2)th order version of the difference filter 18 integrated within the ASIC of FIG. 2. This configuration employs one additional delay unit 26 than the (4+0+2)th order difference filter configuration depicted in FIG. 3. The additional delay unit 26 is highlighted with a thicker box outline in FIG. 15. The additional delay unit 26 causes one digital value to be skipped.

Figure 16:
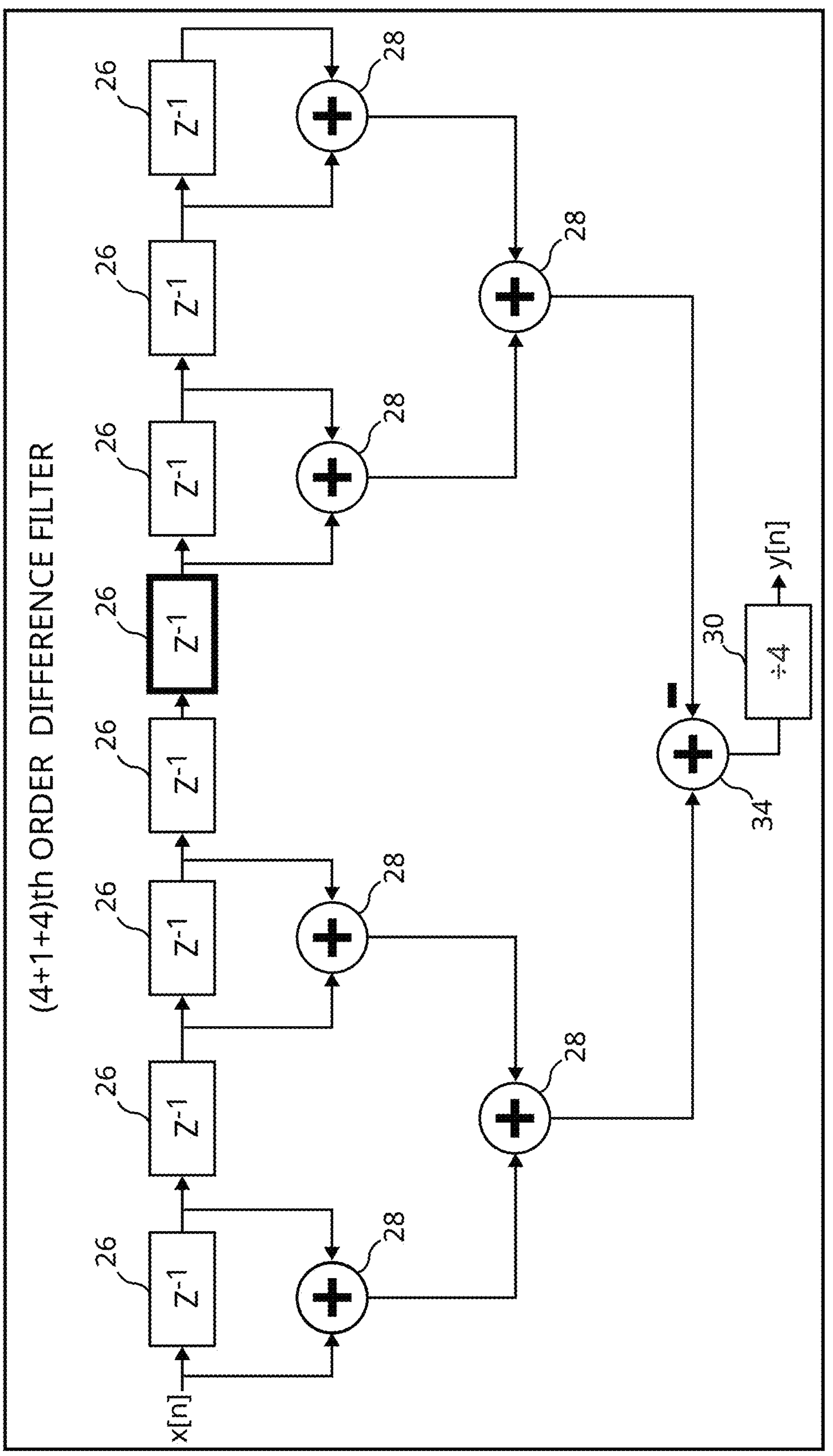
FIG. 16 is a diagram of a (4+1+4)th order version of the difference filter integrated within the ASIC of FIG. 2.

FIG. 16 is a diagram of a (4+1+4)th order version of the difference filter 18 integrated within the ASIC of FIG. 2. This configuration employs one additional delay unit 26 than the (4+0+4)th order difference filter configuration depicted in FIG. 5. The additional delay unit 26 is highlighted with a thicker box outline in FIG. 16. Just as with the embodiment of FIG. 15, the additional delay unit 26 causes one digital value to be skipped.

Figure 17:
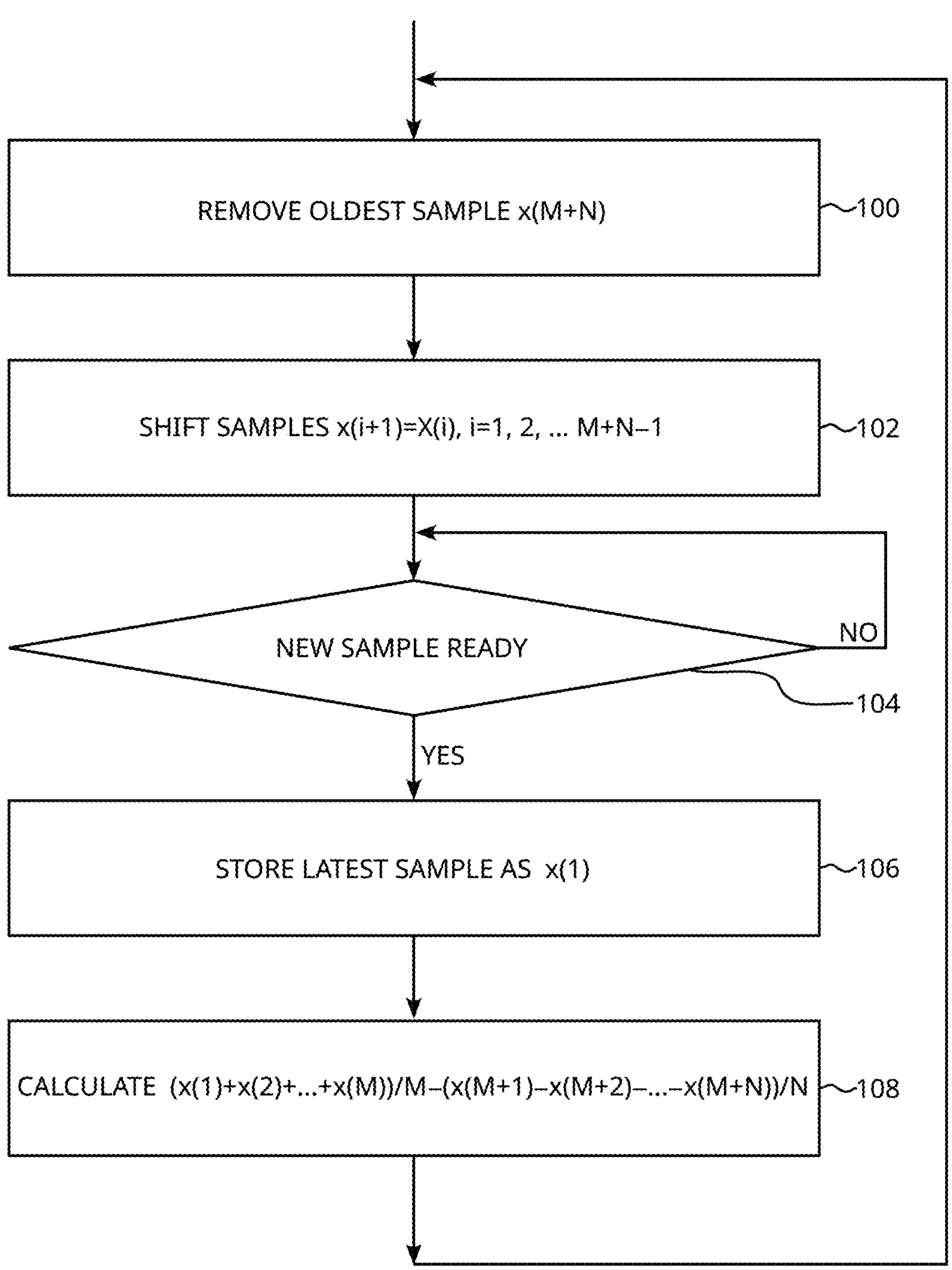
FIG. 17 is a flow chart for a method of calculating one output sample that is filtered by an (M+0+N)th-order difference filter.

FIG. 17 is a flow chart for a method of calculating one output sample that is filtered by an (M+0+N)th-order difference filter. The method may begin by removing an oldest sample x(M+N), step 100. Another step shifts samples by one increment, step 102. The method then waits for a new sample, step 104. A new sample is then stored in a memory as x(1), step 106. A calculation is then made to generate a filtered output sample using equation 2, step 108. The method executes step 100 through 108 until all input samples x(n) are processed.

Figure 18:
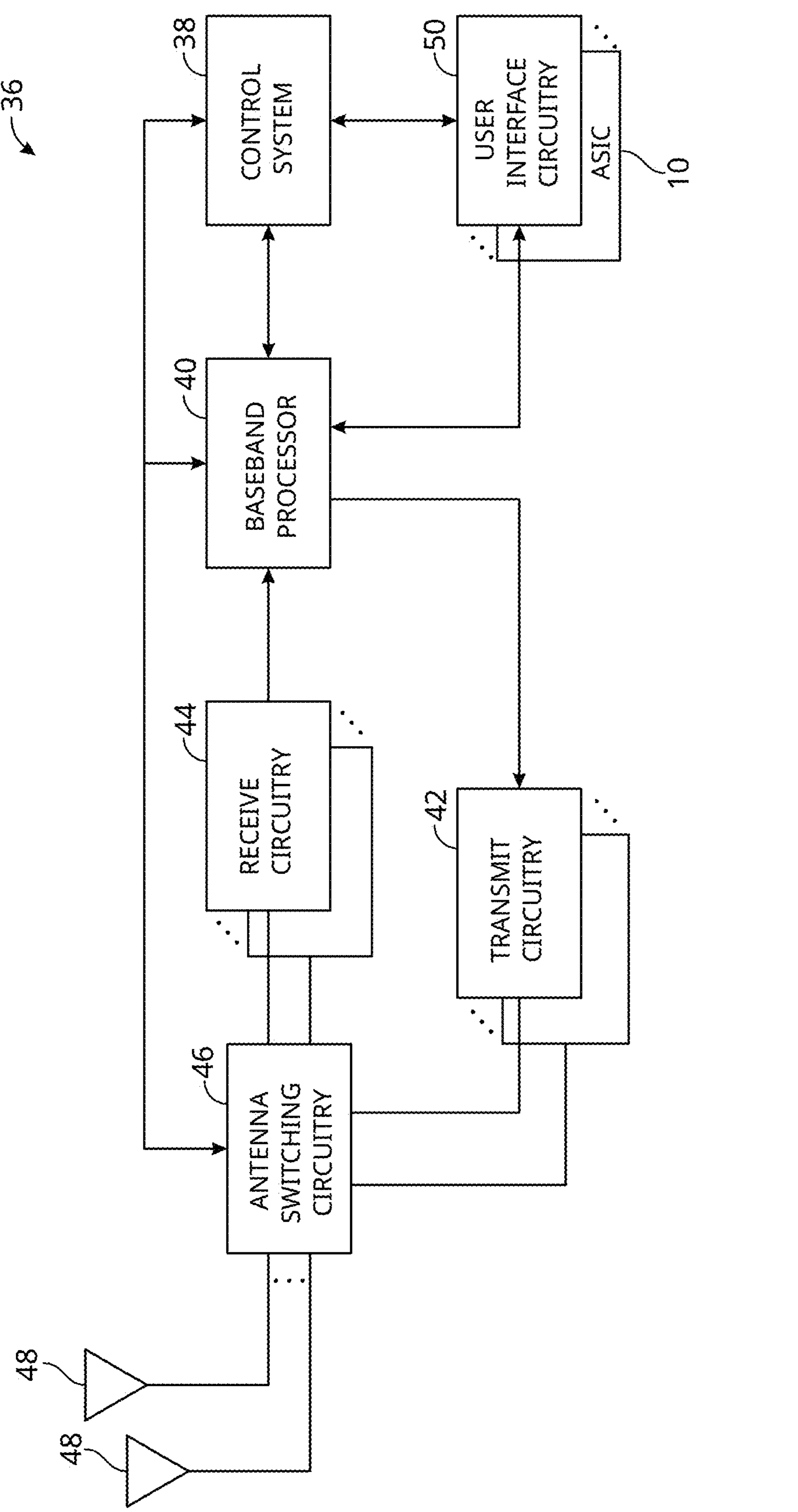
FIG. 18 is a diagram showing how the disclosed integrated circuit may interact with user elements such as wireless communication devices.

With reference to FIG. 18, the concepts described above may be implemented in various types of wireless communication devices or user elements 36, such as mobile terminals, smart watches, tablets, computers, navigation devices, access points, and the like that support wireless communications, such as cellular, wireless local area network (WLAN), Bluetooth, and near-field communications. The user elements 36 will generally include a control system 38, a baseband processor 40, transmit circuitry 42, receive circuitry 44, antenna switching circuitry 46, multiple antennas 48, and user interface circuitry 50 that includes the ASIC 10 (FIG. 2). The receive circuitry 44 receives radio frequency signals via the antennas 48 and through the antenna switching circuitry 46 from one or more basestations. A low-noise amplifier and a filter cooperate to amplify and remove broadband interference from the received signal for processing. Downconversion and digitization circuitry (not shown) will then downconvert the filtered, received signal to an intermediate or baseband frequency signal, which is then digitized into one or more digital streams.

The baseband processor 40 processes the digitized received signal to extract the information or data bits conveyed in the received signal. This processing typically comprises demodulation, decoding, and error correction operations. The baseband processor 40 is generally implemented in one or more digital signal processors and application-specific integrated circuits.

For transmission, the baseband processor 40 receives digitized data, which may represent voice, data, or control information, from the control system 38, which it encodes for transmission. The encoded data is output to the transmit circuitry 42, where it is used by a modulator to modulate a carrier signal that is at a desired transmit frequency or frequencies. A power amplifier will amplify the modulated carrier signal to a level appropriate for transmission and deliver the modulated carrier signal to the antennas 48 through the antenna switching circuitry 46 to the antennas 48. The antennas 48 and the replicated transmit and receive circuitries 42, 44 may provide spatial diversity. Modulation and processing details will be understood by those skilled in the art.

It is contemplated that any of the foregoing aspects, and/or various separate aspects and features as described herein, may be combined for additional advantage. Any of the various embodiments as disclosed herein may be combined with one or more other disclosed embodiments unless indicated to the contrary herein.

Those skilled in the art will recognize improvements and modifications to the preferred embodiments of the present disclosure. All such improvements and modifications are considered within the scope of the concepts disclosed herein and the claims that follow.

What is claimed is:

1. An integrated circuit comprising:

a sensor configured to sense a stimulus and in response to output an analog signal;

an analog-to-digital converter configured to receive the analog signal and to output a stream of digital values that are in proportion to the analog signal; and a difference filter configured to receive the digital values and subtract an N number of the digital values from an M number of the digital values to generate filtered values, wherein M and N are counting numbers and the difference filter is configured to calculate a resultant for the equation:

$$y(n) = \frac{1}{M}\sum_{i=n-M+1}^{n} x(i) - \frac{1}{N}\sum_{j=n-M-N-Z+1}^{n-M-Z} x(j),$$

wherein Z is a counting number that is a number of digital values to skip while calculating the resultant.

2. The integrated circuit of claim 1 further comprising a controller configured to set the order of the difference filter.

3. The integrated circuit of claim 2 wherein the controller is further configured to set resolution for the analog-to-digital converter.

4. The integrated circuit of claim 2 further comprising a driver stage configured to energize the sensor.

5. The integrated circuit of claim 4 wherein the controller is further configured to set the energization level and time interval provided to the sensor by the driver stage.

6. The integrated circuit of claim 2 further comprising a gain stage configured to scale the amplitude of an analog sensor signal generated by the sensor and output a gain adjusted version of the analog sensor signal to the analog-to-digital converter.

7. The integrated circuit of claim 6 wherein the controller is further configured to set a gain level for the gain stage that scales the amplitude of the analog sensor signal.

8. The integrated circuit of claim 2 further comprising a stimulus detector configured to receive the filtered values and detect from the filtered values the stimulus sensed by the sensor.

9. The integrated circuit of claim 8 wherein the controller is further configured to set amplitude thresholds of the stimulus detector.

10. A method of operating an integrated circuit comprising a sensor configured to sense a stimulus and in response to output an analog signal, an analog-to-digital converter configured to receive the analog signal and to output a stream of digital values that are in proportion to the analog signal, and a difference filter configured to process the digital values with the method comprising subtracting an N number of the digital values from an M number of the digital values to generate filtered values, wherein M and N are counting numbers and the difference filter is configured to calculate a resultant for the equation:

$$y(n) = \frac{1}{M}\sum_{i=n-M+1}^{n} x(i) - \frac{1}{N}\sum_{j=n-M-N-Z+1}^{n-M-Z} x(j),$$

wherein Z is a counting number that is a number of digital values to skip while calculating the resultant.

11. A wireless communication device comprising:

receive circuitry configured to receive radio frequency (RF) signals;

a baseband processor configured to process a digitized version of the RF signals received by the receive circuitry and to extract the information or data bits conveyed in the received RF signals;

transmit circuitry configured to receive encoded data from the baseband processor and to modulate a carrier signal with the encoded data; and user interface circuitry configured to communicate user input to the baseband processor, the user interface circuitry comprising:

a sensor configured to sense a stimulus and in response to output an analog signal;

an analog-to-digital converter configured to receive the analog signal and to output a stream of digital values that are in proportion to the analog signal; and a difference filter configured to receive the digital values and to subtract an N number of the digital values from an M number of the digital values to generate filtered values, wherein M and N are counting numbers and the difference filter is configured to calculate a resultant for the equation:

$$y(n) = \frac{1}{M}\sum_{i=n-M+1}^{n} x(i) - \frac{1}{N}\sum_{j=n-M-N-Z+1}^{n-M-Z} x(j),$$

wherein Z is a counting number that is a number of digital values to skip while calculating the resultant.

12. The wireless communication device of claim 11 further comprising a controller configured to set the order of the difference filter.

13. The wireless communication device of claim 12 wherein the controller is further configured to set resolution for the analog-to-digital converter.

14. The wireless communication device of claim 12 further comprising a driver stage configured to energize the sensor.

15. The wireless communication device of claim 14 wherein the controller is further configured to set the energization level and time interval provided to the sensor by the driver stage.

16. The wireless communication device of claim 12 further comprising a gain stage configured to scale the amplitude of an analog sensor signal generated by the sensor and output a gain adjusted version of the analog sensor signal to the analog-to-digital converter.

17. The wireless communication device of claim 16 wherein the controller is further configured to set a gain level for the gain stage that scales the amplitude of the analog sensor signal.

18. The wireless communication device of claim 12 further comprising a stimulus detector configured to receive the filtered values and detect from the filtered values the stimulus sensed by the sensor, wherein the controller is further configured to set amplitude thresholds of the stimulus detector.

19. The wireless communication device of claim 11 wherein the sensor, the analog-to-digital converter, the difference filter, and stimulus detector are integrated into an application-specific integrated circuit.

* * * * *